(12) United States Patent
Chen et al.

(10) Patent No.: US 8,307,163 B2
(45) Date of Patent: Nov. 6, 2012

(54) HYBRID DENSITY MEMORY STORAGE DEVICE

(75) Inventors: Ming-Dar Chen, Hsinchu (TW); Chuan-Sheng Lin, Hsinchu County (TW); Hui-Neng Chang, Taoyuan County (TW); Hsiang-An Hsieh, Taipei (TW)

(73) Assignee: A-Data Technology Co., Ltd., Taipei (TW)

( * ) Notice: Subject to any disclaimer, the term of this patent is extended or adjusted under 35 U.S.C. 154(b) by 975 days.

(21) Appl. No.: 12/050,593

(22) Filed: Mar. 18, 2008

(65) Prior Publication Data
US 2008/0235468 A1 Sep. 25, 2008

Related U.S. Application Data

(60) Provisional application No. 60/907,088, filed on Mar. 19, 2007.

(51) Int. Cl.
*G06F 12/00* (2006.01)
(52) U.S. Cl. . 711/137; 711/103; 711/154; 711/E12.001; 365/185.33
(58) Field of Classification Search .................. 711/113, 711/207, E12.072, 103, 137, 154, E12.001; 365/185.33
See application file for complete search history.

(56) References Cited

U.S. PATENT DOCUMENTS

| | | | | |
|---|---|---|---|---|
| 6,003,115 | A * | 12/1999 | Spear et al. | 711/137 |
| 6,009,498 | A * | 12/1999 | Kumasawa et al. | 711/113 |
| 6,807,106 | B2 * | 10/2004 | Gonzales et al. | 365/185.33 |
| 2005/0251617 | A1 * | 11/2005 | Sinclair et al. | 711/103 |

* cited by examiner

*Primary Examiner* — Jasmine Song
(74) *Attorney, Agent, or Firm* — Rosenberg, Klein & Lee

(57) ABSTRACT

The present invention discloses a hybrid density memory storage device configured to store data responsive to a host and a file system thereof. The hybrid density memory storage device includes a non-volatile memory, a hot data buffer and a control unit. The non-volatile memory includes a high density storage space and a low density storage space. The control unit is coupled between the host, the non-volatile memory, and the hot data buffer. The control unit has a hot list used for recording a plurality of logical locations of hot data, and the control unit is capable of accessing data in/out the hot data buffer in accordance with the hot list.

18 Claims, 6 Drawing Sheets

HYBRID DENSITY MEMORY STORAGE DEVICE

BACKGROUND OF THE INVENTION

1. Field of the Invention

The present invention relates to a storage device; in particular, to a hybrid density memory storage device.

2. Description of Related Art

Non-volatile memory (also known as Electrically Independent memory) is used to store data, commonly applied to storage devices (e.g. as memory card, thumb drive with USB interface, solid state drive etc.) and digital devices to be employed in conjunction therewith for data storage. Flash memory provides advantages of high storage density, low power consumption, effective access efficiency and reasonable price, thus becoming nowadays the mainstream of current non-volatile memory devices.

The memory represents the stored bit values by voltage values conserved in memory cells. In traditional memory storage technology, a bit data as one (1) or zero (0) is record by means of high level or zero level of the voltage value conserved in one memory cell. As the technologies in semiconductor processes advance, it is possible to further divide the level values conserved within a memory cell, so that more different voltage values can be stored in one memory cell, thus storing more bit values. For example, if a memory cell can retain four different level values, it may store two-bit data. The industry refers the traditional memory manufacture technology for storing one single bit data as the Single-Level-Cell (SLC) process, and memory fabricated thereby as low density memory; memory manufacture technology for storing multi-bit data as the Multi-Level-Cell (MLC) process, and memory fabricated thereby as high density memory.

Compared with low density memory, the data storage capacity provided within a unit area of high density memory increases multifold, offering desirable advantages in terms of significantly increased storage capacity and decreased cost, but it requires longer times for data read/write and erase actions; besides, the MLC process also results in significant reduction in endurance count, collaterally affecting hardware performance such as data access rate and life span in high density memory storage.

The features of high density memory lie in high storage capacity, low cost, low data access rate and low endurance count; contrarily, the advantages of low density memory exist in high erase endurance, high data access rate, low storage capacity and low cost. Since each type of memory respectively demonstrates features thereof, the industry therefore has devoted in the development and application of hybrid density memory. The so-called hybrid density memory comprises both high density memory and low density memory at the same time. Exploiting the advantages of both types of memory to enhance storage performance, has now become a major research subject aggressively promoted by the relevant industries.

Refer now to FIGS. 1A and 1B, which show storage management diagrams for hybrid density memory in the prior art. FIG. 1A illustrates the arrangement of a logical block 80 in a file, and FIG. 1B shows the arrangement of a physical block 82 in the file. As shown in FIGS. 1A and 1B, such a technology stores the individual physical locations for the spare area or control data area 800 and user data area 805 of the file respectively into the low density memory block 820 and high density memory block 825. The reason for this arrangement is that the control data area 800 registering file control information has stronger requirement on access rate; hence, it is allocated in the low density memory storage block 820. However, in such a technology, file update will perform erase actions on corresponding memory blocks 820, 825 respectively for the control data area 800 and the user data area 805 at the same time, thus the high density memory is very likely to achieve its endurance count earlier, causing that the high density memory loses its function before the storage effect of the low density memory being fully employed, resulting in early failure of the memory and wastes of storage resources.

The defects of the above-mentioned method can be improved by means of wear-leveling management technology for hybrid density memory. Said wear-leveling management is to generate weights based on the inverse ratio of endurance counts in the high and low density memories to adjust the erase count recorded for each storage block, then to allocate the physical location of the file according to adjusted erase count, such that the high density memory and low density memory inside the storage device may reach their respective endurance count simultaneously as much as possible, so as to fully exploit the available storage resources. Meanwhile, file allocation management is based on the attribute (e.g. extension name) of the file to assign the physical location of the file to the low density memory or high density memory, in order to store the files requiring higher data access rate or frequently used to the low density memory providing high endurance count. In this file allocation management method, if the storage device can not correctly identify the file system or file attribute, it is impossible to correctly allocate the file to the appropriate memory, thus the objective of storage performance improvement may not be reached.

The defects of the above-mentioned method can be solved by categorizing frequently used data of the file system as hot data, building a hot list inside the storage device, recording the logical location of the hot data, and assigning the physical location of the hot data to the low density memory, so as to fully exploit the life span of low density memory and acquire high data access rate. Although said method can exploit the life span of the low density memory and utilize the high data access rate provided by the low density memory, it can not, however, provide the effect of extending life span of storage device by reducing the erase count of the non-volatile memory. In view of this factor, the inventors propose the present invention with an expectation to accelerate system operation speed and reduce erase count in the non-volatile memory, so as to extend the life span of the storage device.

SUMMARY OF THE INVENTION

Therefore, the objective of the present invention is to provide a hybrid density memory storage device, which offers a hot list buffer in the hybrid density memory storage device, allowing to access data from the hot data buffer based on the hot list, such that the performance of system operation can be enhanced and the erase count in the non-volatile memory can be reduced.

The present invention discloses a hybrid density memory storage device, which is suitable for use as data storage in conjunction with a host computer and its file system. Said hybrid density memory storage device comprises a non-volatile memory unit, a hot data buffer and a control unit. The non-volatile memory unit comprises a high density memory storage space and a low density memory storage space; the control unit is coupled between the host computer, the non-volatile memory unit and the hot data buffer, wherein the control unit has a hot list to record a plurality of logical locations belonging to the hot data of the file system, such that the control unit can access data from the hot data buffer according to the hot list.

The above-mentioned summary as well as subsequent descriptions and appended drawings are all for further illustrating the measures, means and effects taken by the present invention to achieve the prescribed objectives. Other goals and advantages of the present invention will be explained in details in the following descriptions and drawings.

DETAILED DESCRIPTION OF THE PREFERRED EMBODIMENTS

The hybrid density memory storage device according to the present invention is a type of hybrid density memory storage device provided with a hot data buffer formed by the high speed memory for registering hot data, such that it can access data from the hot data buffer to achieve the effects of increasing data access speed and reducing erase count in the non-volatile memory.

Figure 1A:
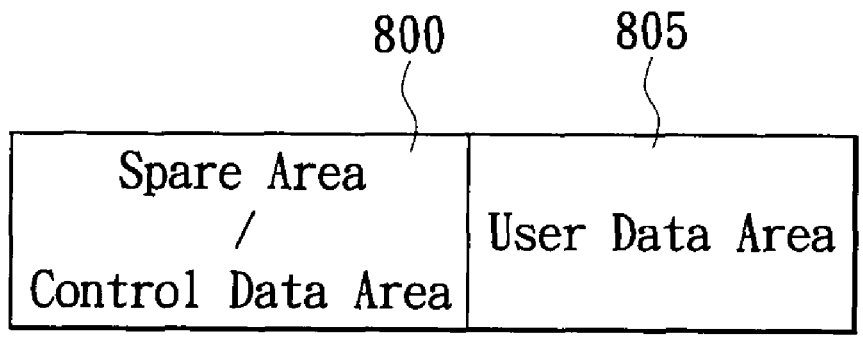
FIGS. 1A and 1B show diagrams of prior art storage management for hybrid density memory.
Figure 1B:
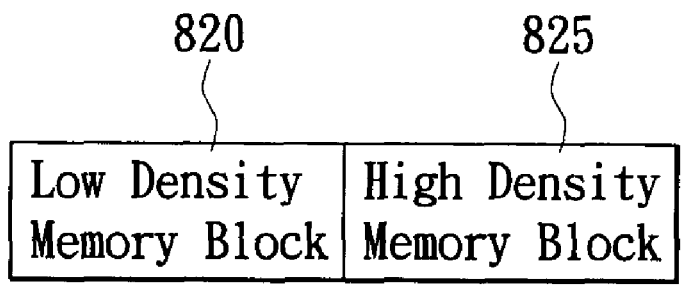
Figure 2:
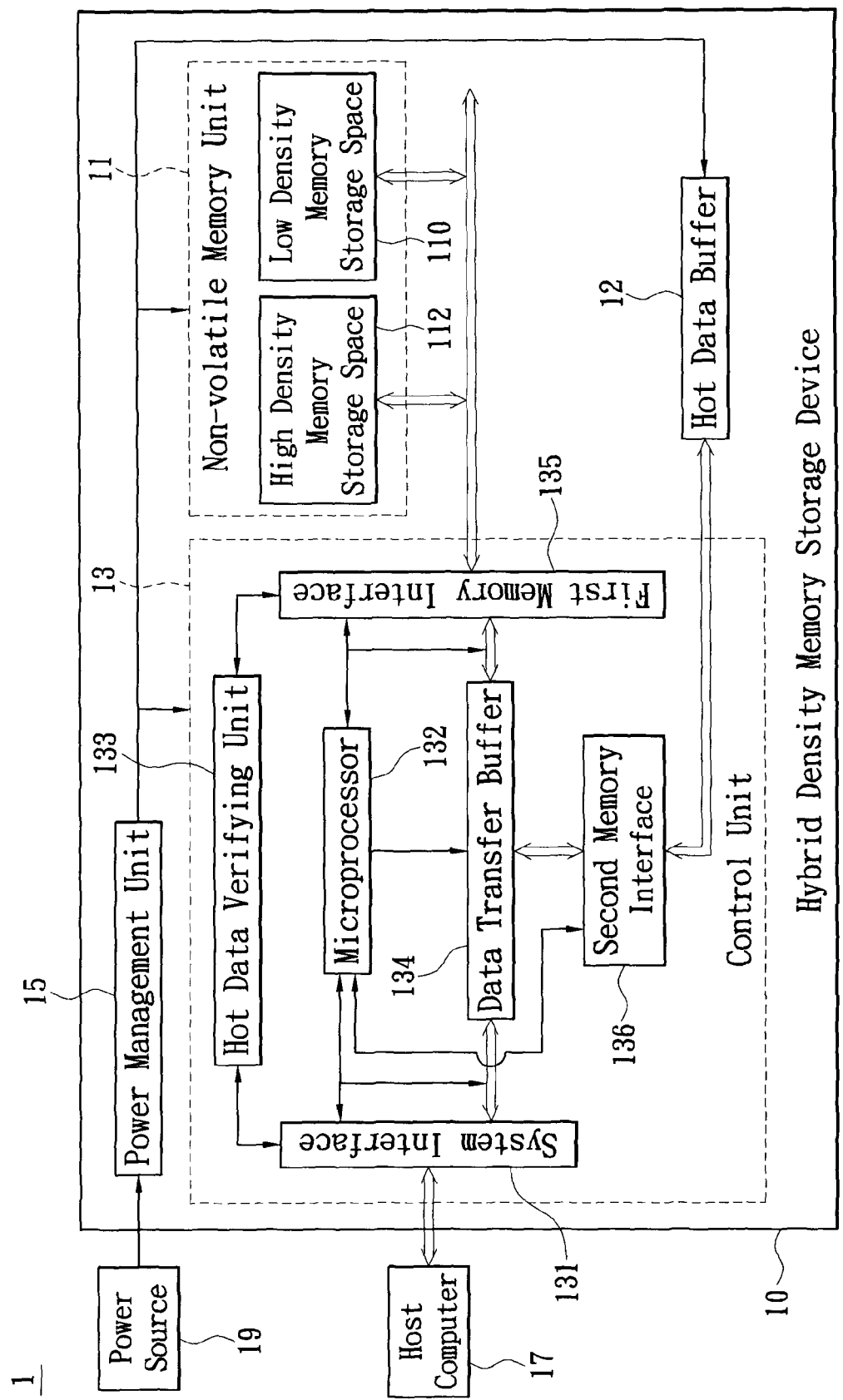
FIG. 2 shows a system architecture diagram of an embodiment of the hybrid density memory storage device according to the present invention.

First of all, refer to FIG. 2, wherein a system architecture diagram of an embodiment of the hybrid density memory storage device according to the present invention is shown. As illustrated in FIG. 2, a hybrid density memory storage device 10 (hereunder referred as a storage device) is applied in a digital system 1, coupled to a host computer 17, and used in conjunction with the host computer 17 and the file system thereof as data storage. In practice, the digital system 1 may be a computer system, the host computer 17 a host computer, while the storage device 10 is responsible for the execution of hard drive function in the computer system, and operates accordingly to execute data read/write based on the instructions issued from the host computer 17.

The storage device 10 comprises a non-volatile memory unit 11, a hot data buffer 12, a control unit 13 and a power source management unit 15. The non-volatile memory unit 11 is formed by flash memory, comprising a low density memory storage space 110 and a high density memory storage space 112. The low density memory storage space 110 is formed by low density memory, and the high density memory storage space 112 is formed by high density memory. The aspects of low density memory are low storage capacity per unit, high endurance count and fast data access rate, whereas the aspects of high density memory lie in high storage capacity, low endurance count and slow data access rate.

The power source management unit 15 is coupled to a power source 19, receiving whose output power and transforming the received power into the power source required by the control unit 13 and the non-volatile memory unit 11.

The host computer 17 manages the file data stored in the storage device 10 based on a system architecture regulated under FAT12, FAT16, FAT32 or NTFS files systems. By using the Flash Transition Layer (FTL), the storage device 10 maps and converts the logical location of the file to the physical location of the non-volatile memory unit 11.

Here, the transition method between logical location and physical location will be briefly explained. The present mainstream storage media is flash memory, while the computer system is based on the concept of Logical Block Address (LBA), which prescribes correspondence between the logical block address and storage block in the flash memory, and then, according to the correspondence, forms a transition table in the firmware of the storage device 10. During data access, the host computer 17 first converts the logical address (LA) of the file into the logical block address, and, during such a data access process, the hard drive is only instructed to mark logical locations of the logical address to be accessed and logical block address etc. in the assigned fields of the command. After the command being decoded by the storage device 10, the Flash Transition Layer (FTL) transits the logical location of the file to physical location according to the transition table built previously by the firmware.

The frequently used or user-assigned files of the file system are categorized as hot data, and a hot list is used to record the logical locations of these hot data. The control unit 13 is coupled between the host computer 17 and the non-volatile memory unit 11, which has a hot list to record a plurality of logical locations belonging to the hot data, and the control unit 13 may store the data in the high density memory storage space 112 or the low density memory storage space 110 based on the hot list. In practice, the hot list is stored in the non-volatile memory unit 11, while the control unit 13 may register and manage the hot list. After the start of the digital system 1, the control unit 13 loads and registers the hot list, and, according to the hot list, verifies whether the file that the command issued by the host computer 17 intends to read/write belongs to hot data, thus accordingly determines whether the physical location of the file should be assigned to the low density memory storage space 110 or the high density memory storage space 112. If the logical location of the file belongs to one of the logical locations recorded in the hot list, then the physical location thereof is assigned to the low density memory storage space 110, so as to exploit the advantages of high endurance count and high access rate of low density memory.

The principal aspects of the present invention lie in allowing the storage device 10 to have a hot data buffer 12. The hot data buffer 12 are composed of high speed memory, wherein said high speed memory may be high speed volatile memory (e.g. static random access memory (SRAM), pseudo-static random access memory (PSRAM), dynamic random access memory (DRAM) and the like), or high speed non-volatile memory (e.g. Ferro-electrical Random Access Memory (FeRAM), Magnetic Random Access Memory (MRAM), Phase-Change Random Access Memory (PCRAM) etc.) The control unit 13 may load data into the hot data buffer 12 for registry based on the hot list. In practice, the control unit 13 can dynamically employ the resources of the hot data buffer 12 in conjunction with the operation mode of the host computer 17. According to the hot list, the hot data is preloaded from the non-volatile memory unit 11 to the hot data buffer 12 for registry, and the write-in data of the host computer 17 is first registered in the hot data buffer 12, so that the data may be accessed from the hot data buffer 12 during later processes. In this way, it is possible significantly increase the data response speed of the storage device 10 to the host computer 17, and at the same reduce the erase count in the non-volatile memory unit 11.

The operation modes of the host computer 17 comprise three modes: a start mode, a read mode and a write mode, and the hot list may be a start hot list, a read hot list and a write hot list, respectively recording logical locations of hot data for the start, read and write operation modes. The start hot list records the specific logical locations of the file data that the host computer 17 frequently reads or writes in a start cycle (i.e. a specific period of time when the system executes boot process; for example, 30 seconds); the read hot list records the specific logical locations of the file data that the host computer 17 frequently reads, and the write hot list records the specific logical locations of the file data that the host computer 17 frequently writes.

According to the start hot list and the read hot list, the hot data is preloaded from the low density memory storage space 110 to the hot data buffer 12 for registry, allowing to access data from the hot data buffer 12, thus increasing the response time to the command. In particular, when the digital system 1 is started, it generally repeats the same operations (processes like loading the operating system, for example); by means of the above-mentioned operation method, it is possible to largely accelerate the start speed of the host computer 17. On the other hand, by registering the write-in data of the host computer 17 in the hot data buffer 12, the file data updates may all take place in the hot data buffer 12, and save the updates in the non-volatile memory unit 11 when the system performs a shut-down procedure or at some user-appointed time points; in this way, it is possible to reduce the erase count in the non-volatile memory unit 11, extending the life span of the storage device 10.

The inventors of the present application divide the hot data buffer 12 into a start buffer, a read buffer and a write buffer, so as to match accordingly the hot data of the host computer 17 in start mode, read mode and write mode; based on the operation mode of the host computer 17, the control unit 13 may dynamically schedule the memory capacity of each buffer as actually required. For instance, in the start mode, the control unit 13 may expand the memory capacity of the start buffer and completely close the read buffer and write buffer; after the termination of the start mode, it closes the start buffer, and schedules the memory capacities for the read buffer and write buffer according to the ratio between the numbers of logical sections in the loaded read hot data and write hot data.

In FIG. 2, the control unit 13 comprises a system interface 131, a microprocessor 132, a hot data verifying unit 133, a data transfer buffer 134, a first memory interface 135 and a second memory interface 136.

The system interface 131 is coupled to the host computer 17, acting as a transfer interface between the host computer 17 and the storage device 10 for receiving the command from the host computer 17 and transferring the data corresponding to the command. The microprocessor 132 is coupled to the system interface 131 for receiving, processing and responding to the command, so as to control the operations of the storage device 10 and the control unit 13. The hot list is registered in the hot data verifying unit 133, in which the hot data verifying unit 133 is coupled to the system interface 131, identifying the logical location of the command, verifying whether the logical location of the command belongs to one of the logical locations recorded in the hot list, and further outputting a verification to the microprocessor 132; the hot data verifying unit 133 also updates the hot list based on the read/write command. The microprocessor 132 operates in conjunction with various operation mode to dynamically schedule the memory capacities of the start buffer, read buffer and write buffer in the hot data buffer 12; loads the data into the start buffer, read buffer and write buffer of the hot data buffer 12 for storage; and determines whether the data in the hot data buffer 12 matches the requirement of the command issued by the host computer, so as to further control the data cache and swap of the hot data buffer 12.

The data transfer buffer 134 is coupled to the system interface 131 for registering the data transferred to the storage device 10 by the host computer 17, or registering the data to be read from the storage device 10 by the host computer 17. The first memory interface 135 is coupled between the data transfer buffer 134 and the non-volatile memory unit 11 as a data transfer interface between the control unit 13 and the non-volatile memory unit 11. The second memory interface 136 is coupled between the data transfer buffer 134 and the hot data buffer 12 as a data transfer interface between the control unit 13 and the non-volatile memory unit.

Figure 3:
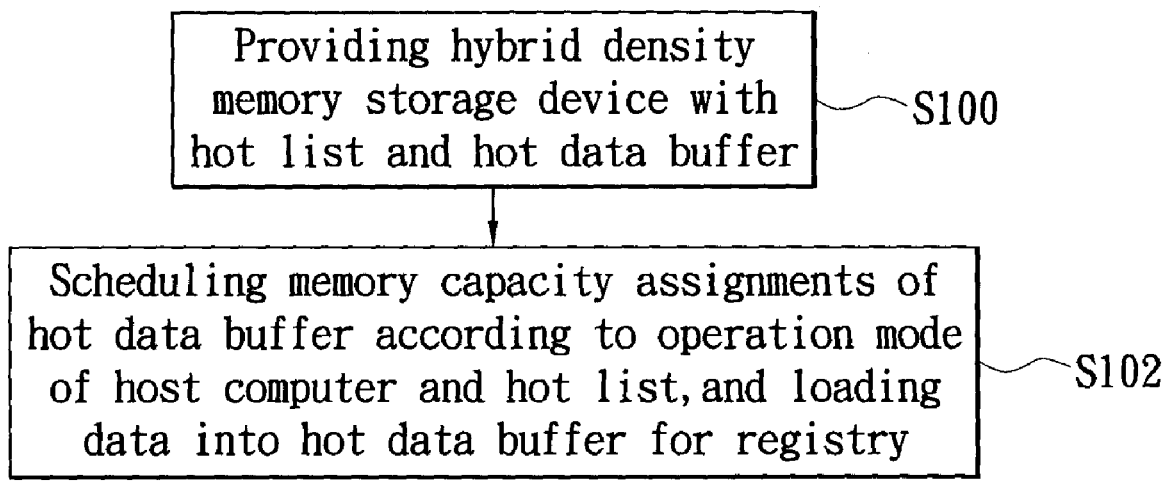
FIG. 3 shows a step-wise flowchart of the hot data cache method according to the present invention.

Hereunder the present invention further provides a hot data cache method. Referring now to FIG. 3, a step-wise flowchart of the hot data cache method according to the present invention is shown. The related system architecture referred in FIG. 3, such as the hybrid density memory device, therefore it may be helpful to simultaneously refer to FIGS. 2 and 3. As illustrated in FIG. 2, said hot data cache method comprises the following steps:

First, the storage device 10 is provided with a hot list and a hot data buffer 12 formed by high speed memory, in which said hot list records a plurality of logical locations belonging to the hot data of the file system (step S100); and Subsequently, according to the operation mode of the host computer 17, it schedules the memory capacity assignments of the start buffer, read buffer and write buffer of the hot data buffer 12, loading the data into the hot data buffer 12 for registry, so as to directly access the data therein (step S102).

To work with the operation mode of the host computer 17, said hot data cache method comprises start cache mode, read cache mode and write cache mode. When the operation mode is in the start mode and read mode, it selects at least one specific location in the hot list, and preloads the data at the selected specific logical location from the non-volatile memory unit 11 to the hot data buffer 12. When the operation mode is in the write mode, it loads the data written by the host computer 17 to the hot data buffer 12.

In this way, in case the data for the read/write command issued by the host computer 17 has been loaded in the hot data buffer 12, it is possible to read file data directly from the hot data buffer 12, achieving the effect of increasing data response speed of the hybrid density memory storage device 10 to the host computer 17.

Additionally, the consecutive logical locations in the hot list form a logical section, and since it is very probable that the data in continuous logical locations are consecutively read/written, the present invention schedules the control unit 13 to preload the hot data of entire logical section to the hot data buffer 12 for registry, and said specific logical location refers to a logical section. The hot list generally consists of a plurality of logical sections, and the logical sections have different priorities for loading. The control unit 13 initially selects the hot data of at least on logical section to load for registry based on operation mode and loading order; next, it swaps the cache data in the hot data buffer 12 according to whether the preloaded cache data matches the requirement of the command issued by the host computer 17, so as to load the hot data of other logical sections. Furthermore, if the data requested by the host computer 17 is not enlisted in the hot list, the hot data verifying unit 133 further updates the hot list to add new logical location.

Hereunder the detailed descriptions of step-wise flowcharts for the start cache mode, read cache mode and write cache mode will be illustrated.

Figure 4:
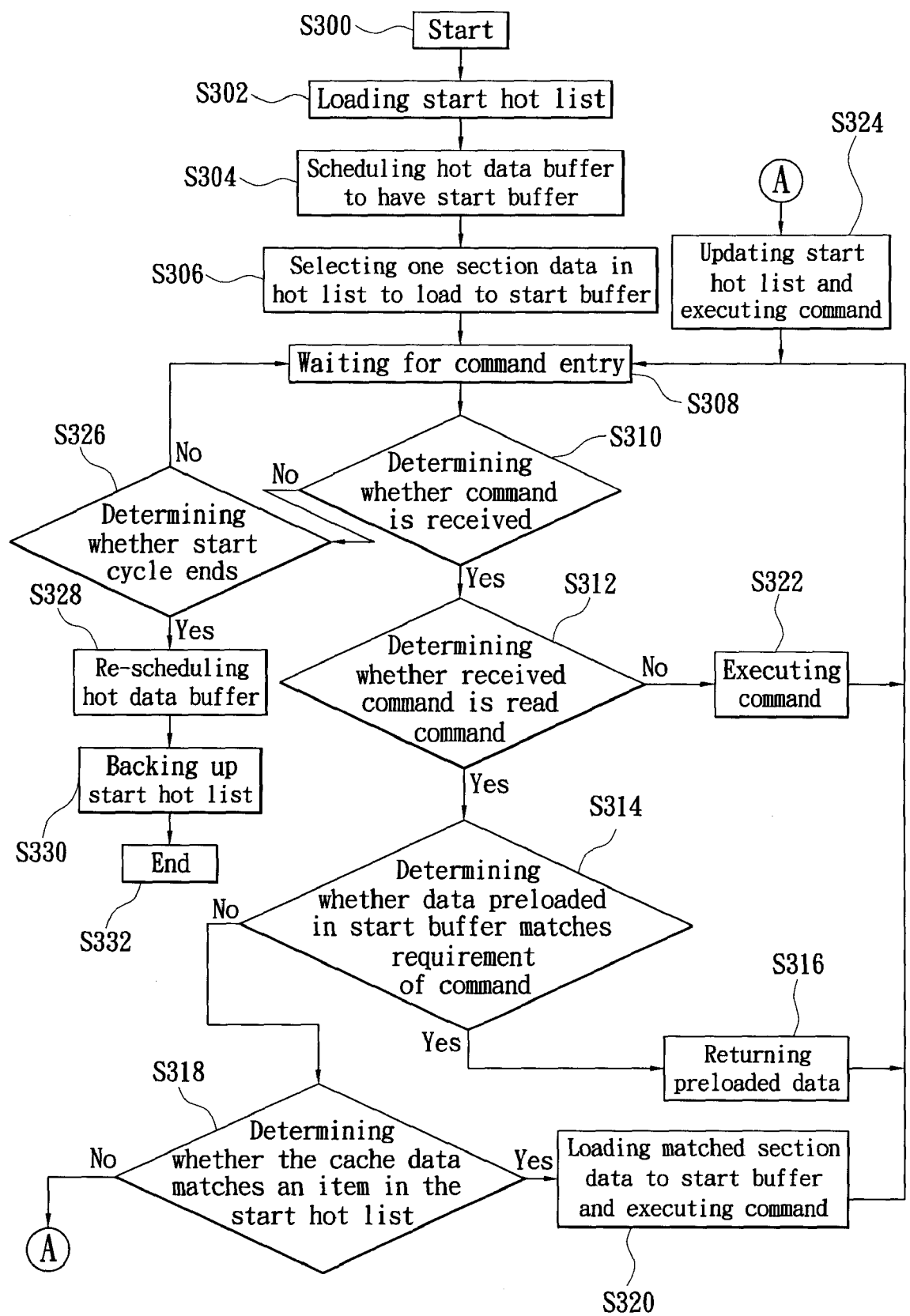
FIG. 4 shows a step-wise flowchart for the start cache mode of the hot data cache method according to the present invention.

Referring now to FIG. 4, a step-wise flowchart for the start cache mode of the hot data cache method according to the present invention is shown. The present invention sets a prescribed period of time after the start of the host computer 17 as the start cycle, and the host computer 17 operates under the start mode in the start cycle. As illustrated in FIG. 4, after the start of the host computer 17 (step S300), the hot data verifying unit 133 loads the start hot list (step S302), schedules the hot data buffer 12 to have a start buffer (step S304), and selects a logical section data of the start hot list to load into the start buffer for registry (step S306). Subsequently, the control unit 13 waits for the command entry from the host computer 17 (step S308), and determines whether the command is received (step S310); if the command is received based on the determination in step S310, it further determines whether the received command is a read command (step S312). If the determination in step S312 is no, then the received command is not a read command, the command is executed (step S322) and the process returns to step S308; if the determination in step S312 is yes, then the received command is a read command, it determines whether the preloaded cache data in the start buffer matches the requirement of the command, matching the logical location of the command (step S314). If the determination in step S314 is yes, that is, the cache data matches the requirement of the command, then the control unit 13 returns the cache data to the host computer 17 (step S316) and the process returns to step S308.

If the determination in step S314 is no, which means the cache data does not match the requirement of the command, then the control unit 13 determines whether the requirement of the command matches an item in the start hot list (step S318). If the determination in step S318 is yes, then the control unit 13 loads the logical section data hitting the logical location to the start buffer, executes the command (step S320) and returns to step S318; if the determination in step S318 is no, then the control unit 13 updates the start hot list, executes the command (step S324) and returns to step S308.

Besides, if the determination in step S310 is no, i.e. the storage device 10 did not receive the command issued by the host computer 17, then it determines whether the start cycle ends (step S326). If the determination in step S326 is no, then the process returns to step S308, where it waits for command entry; if the determination in step S326 is yes, which means the start cycle is terminated, then the control unit 13 re-schedules the hot data buffer 12 and closes start buffer (step S328), and the hot data verifying unit 133 backs up the start hot list to the non-volatile memory unit 11 for storage (step S330), then the start cache mode ends (step S332).

In step S306 of the above-mentioned start cache mode, the selected logical section data is the data usually first read by the host computer 17 during the start period. In read cache mode, the hot data verifying unit 133 continuously detects the data read by the host computer 17 during the start period, so as to update the start hot list accordingly, and after the end of the read cache mode, it backs up the start hot list to the non-volatile memory unit 11 for storage; during next start period, it preloads the start hot data from the non-volatile memory unit 11 to the faster hot data buffer based on the start hot list, so as to rapidly respond to the data that the host computer 17 requests to read during the start period, thus accelerating the start speed of the host computer 17.

After that the host computer 17 has detached from the start mode, the hybrid density memory storage device 10 then enters into the read cache mode and write cache mode.

Figure 5:
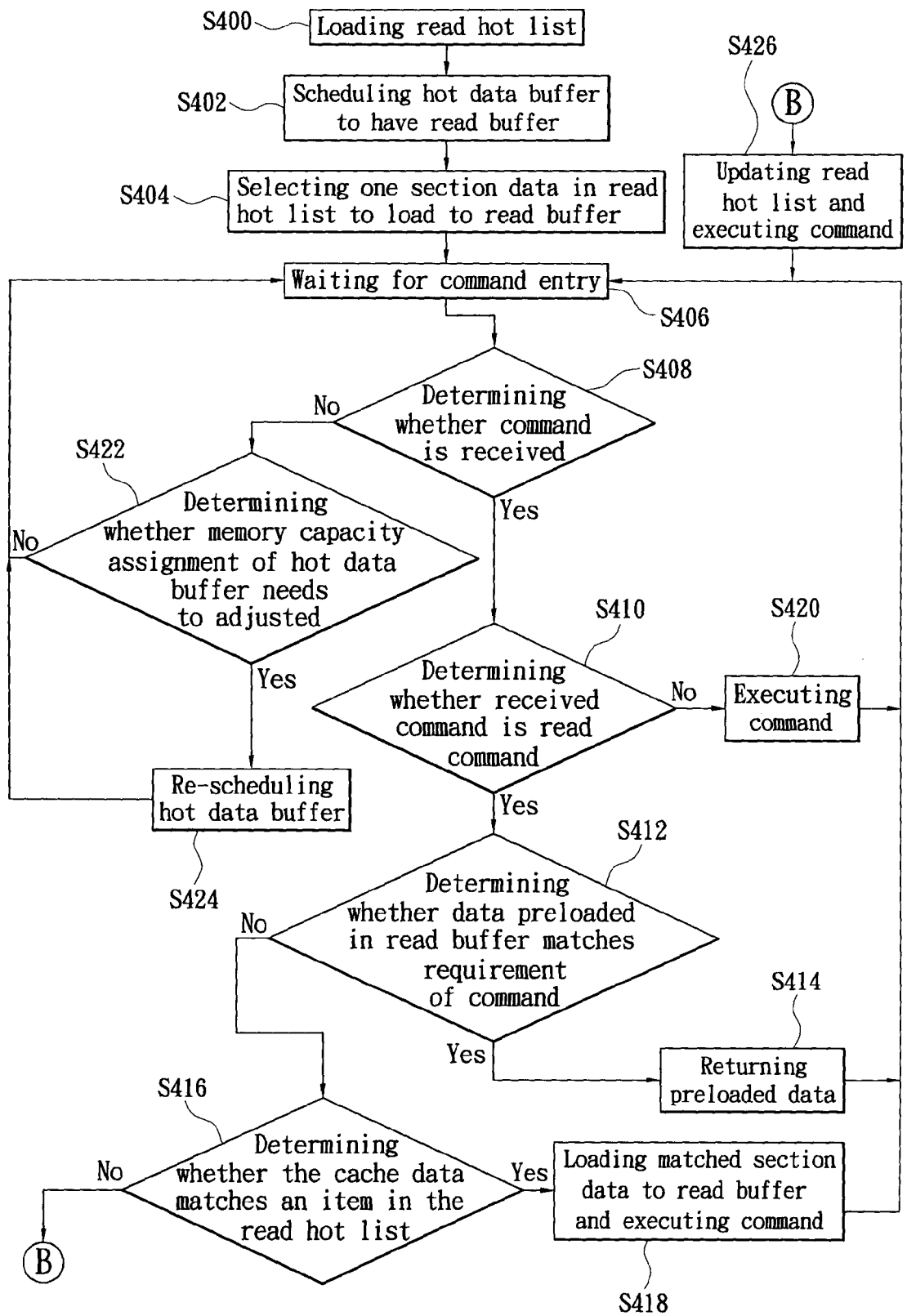
FIG. 5 shows a step-wise flowchart for the read cache mode of the hot data cache method according to the present invention.

Referring now to FIG. 5, a step-wise flowchart for the read cache mode of the hot data cache method according to the present invention is shown. As illustrated in FIG. 5, in the read cache mode, the hot data verifying unit 133 first loads the read hot list (step S400); subsequently, the control unit 13 schedules the hot data buffer 12 to have a read buffer (step S402), and selects one logical section data of the read hot list to load into the read buffer for registry (step S404). Next, the control unit 13 waits for command entry issued from the host computer 17 (step S406), and determines whether a command is received (step S408). If the determination in step S408 is yes, then it further determines whether the received command is a read command (step S410); if the determination in step S410 is no, then the received command is not a read command, then it executes the command (step S420) and the process returns to step S406. In case the determination in step S410 is yes, then the storage device 10 receives the read command issued by the host computer 17, and determines whether the cache data preloaded to the read buffer matches the requirement of the command (step S412); if the determination in step S412 is yes, then it returns the cache data preloaded in the read buffer to the host computer 17 (step S414), and the process returns to step S406.

If the determination in step S412 is no, then the control unit 13 further determines whether the requirement of the command matches an item in the read hot list (step S416), and if the determination in step S416 is yes, then the control unit 13 loads the logical section data in the matched logical location to the read buffer, executes the command (step S418), and returns to step S406. If the determination in step S416 is no, then the hot data verifying unit 133 updates the read hot list (step S426), and returns to step S406.

If the determination in step S408 is no, then the storage device 10 did not receive the command issued by the host computer 17, it then determines whether the memory capacity assignment of the hot data buffer needs to be re-adjusted (step S422). If the determination in step S422 is no, then the process returns to step S406; if the determination in step S422 is yes, then it re-schedules the hot data buffer 12 (step S424), and the process returns to step S406.

Figure 6:
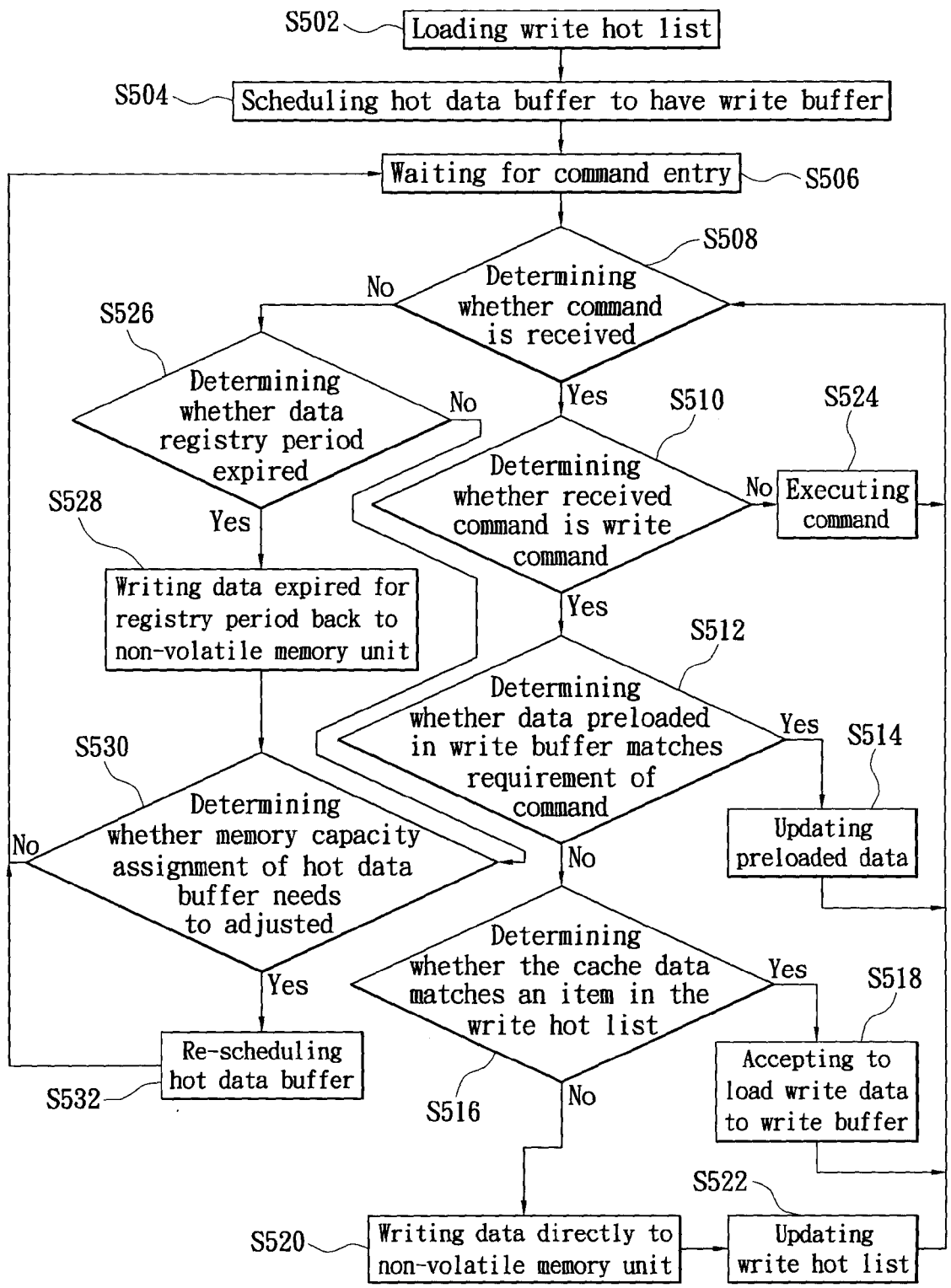
FIG. 6 shows a step-wise flowchart for the write cache mode of the hot data cache method according to the present invention.

Referring now to FIG. 6, a step-wise flowchart for the write cache mode of the hot data cache method according to the present invention is shown. As illustrated in FIG. 6, in the write cache mode, the hot data verifying unit 133 first loads the write hot list (step S502), the control unit 13 schedules the hot data buffer 12 to have a write buffer (step S504) to load the data written by the host computer 17. Next, it waits for the command entry from the host computer 17 (step S506), and determines whether the command issued by the host computer 17 is received (step S508). If the determination in step S508 is yes, then it further determines whether the received command is a write command (step S510); if the determination in step S510 is no, then it executes the command (step S524) and the process returns to step S508. If the determination in step S510 is yes, then it determines whether the cache data preloaded in the write buffer matches the requirement of the command, i.e. the logical location to which the write command specifically writes already exists in the hot data buffer 12, and may be directly accessed from the cache data (step S512). If the determination in step S512 is yes, then it updates the cache data (step S514) and the process returns to step S508.

If the determination in step S512 is no, then the control unit 13 determines whether the requirement of the command matches an item in the write hot list (step S516), and if the determination in step S516 is yes, then the control unit 13 accepts to load the write data to the hot data buffer 12 for updating (step S518). If the determination in step S516 is no, the control unit 13 writes directly the data to the non-volatile memory unit 11 (step S520) and the hot data verifying unit 133 also updates the write hot list (step S522), before the process returns to step S508.

Furthermore, since the memory capacity of the hot data buffer 12 is limited, the present invention prescribes a data registry period (e.g. 500 ms); when the data registry period is expired but the requirement of the command from the host computer 17 is still not matched, the data will be swapped out of the hot data buffer 12 to load in other data. If the determination in step S508 is no, then it determines whether the data registry is expired (step S526), and if the determination in step S526 is yes, then the data registry is expired, and it writes the registry expired data back to the non-volatile memory unit 11 (step S528), and determines whether the memory capacity assignment of the hot data buffer 12 needs to be re-adjusted (step S530). If the determination in step S530 is no, then the process returns to step S506 and waits for command entry; if the determination in step S530 is yes, then it re-schedules the hot data buffer 12 (step S532), and then the process returns to step S506. But, if the determination in step S526 is no, which means the data registry is not expired, then the process goes to step S530, in which it determines whether the memory capacity size of the hot data buffer needs to be re-adjusted.

In the aforementioned three types of cache modes, the write cache mode presents greater difference from the start cache mode and the read cache mode. Since the source of write data is the host computer 17, in the write cache mode there is no action of preloading the hot data from the non-volatile memory unit 11 to the hot data buffer 12. It is also noted that, in step S518, the read cache buffer and the write cache buffer are updated simultaneously, so as to maintain the consistence between read/write data.

By way of the above-mentioned illustrative descriptions of embodiments, it is appreciated that the hybrid density memory storage device of the present invention provides the storage device with hot data buffers formed by high speed memory, allowing direct data access from the hot data buffer according to the operation mode of the host computer and the hot list, which accelerates the data response speed of the hybrid density memory storage device to the host computer, and also reduces the erase count in the non-volatile memory, so as to significantly increase the system operation speed, and extend the life span of the storage device.

The above-mentioned illustrations present simply the detailed descriptions and drawings of the embodiments of the present invention, without any intention to restrict the scope of the present invention thereto. The entire scope of the present invention should be based on the subsequent claims; all changes, substitutions or modifications that persons skilled in the art can easily consider and fabricate are encompassed in the scope of the present invention delineated by the following claims.

What is claimed is:

1. A hybrid density memory storage device, which is suitable for being used as a data storage device in conjunction with a host computer and its file system, said hybrid density memory storage device comprising:
   a non-volatile memory unit, which comprises a high density memory storage space and a low density memory storage space;
   a hot data buffer; and
   a control unit, which is coupled between the host computer, the non-volatile memory unit and the hot data buffer, wherein the control unit has a hot list to record a plurality of logical locations of the file system associated with hot data, allowing for the control unit to access the hot data from the hot data buffer according to the hot list;
   wherein, when an operation mode of the host computer is a start mode or a read mode, the control unit selects at least one of the logical locations in the hot list and preloads a first data corresponding to the selected logical location from the non-volatile memory unit to the hot data buffer, and the control unit further determines whether the first data preloaded in the hot data buffer matches requirement of a command issued by the host computer operating in the start mode or the read mode, when the first data preloaded in the hot data buffer fails to match the requirement of the command issued by the host computer operating in the start mode or the read mode, the control unit further determines whether the command issued by the host computer matches any other logical location recorded in the hot list, and if there is no match, the control unit updates the hot list based on the logical location of the command and executes the command issued by the host computer operating in the start mode or the read mode; and when the operation mode of the host computer is a write mode the control unit is configured to preload a second data that the host computer is configured to write to the hot data buffer, and to receive a write command issued by the host computer.

2. The hybrid density memory storage device according to claim 1, wherein the hot list comprises a start hot list, a read hot list and a write hot list corresponding to the start mode, the read mode and the write mode, respectively.

3. The hybrid density memory storage device according to claim 1, wherein the hot data buffer comprises a start buffer, a read buffer and a write buffer for operating in conjunction with a data registry.

4. The hybrid density memory storage device according to claim 3, wherein the control unit, based on the operation mode of the host computer, dynamically schedules memory capacity sizes of the start buffer, the read buffer and the write buffer.

5. The hybrid density memory storage device according to claim 1, wherein the control unit further executes the following step:
   returning the matched first data preloaded in the hot data buffer to the host computer, when the first data preloaded in the hot data buffer meets the requirement of the command issued by the host computer in the start mode or the read mode.

6. The hybrid density memory storage device according to claim 5, wherein, when the control unit determines the command issued by the host computer in the start mode or the read mode matches the logical location recorded in the hot list, the control unit loads the first data corresponding to the logical location of the command issued by the host computer in the start mode or the read mode to the hot data buffer and executes the command issued by the host computer.

7. The hybrid density memory storage device according to claim 1, wherein, when the operation mode of the host computer is in the start mode, the control unit further executes the following steps:
   setting a start cycle;
   determining whether the start cycle ends; and
   if the start cycle ends, backing up the hot list and storing in the non-volatile memory unit.

8. The hybrid density memory storage device according to claim 1, wherein the control unit further executes the following steps:
- determining whether the second data preloaded in the hot data buffer matches requirement of the write command; and
- if the second data preloaded in the hot data buffer matches the requirement of the write command, executing the write command and updating the second data preloaded in the hot data buffer.

9. The hybrid density memory storage device according to claim 8, wherein if the second data preloaded in the hot data buffer does not match the requirement of the write command, the control unit further determines whether the write command matches the logical location recorded in the hot list, and if there is no match, the control unit executes the write command based on the logical location of the write command, and writes the second data corresponding to the logical location of the write command to the non-volatile memory unit.

10. The hybrid density memory storage device according to claim 9, wherein the control unit further updates the hot list based on the logical location of the write command.

11. The hybrid density memory storage device according to claim 8, wherein the control unit further executes the following steps:
- setting a data registry period;
- determining whether the data registry period is expired; and
- swapping data corresponding to the expired data registry period out of the hot data buffer.

12. The hybrid density memory storage device according to claim 1, wherein the hot data buffer is formed by high speed memory.

13. The hybrid density memory storage device according to claim 12, wherein the high speed memory is selected from a group consisting of a high speed volatile memories and a high speed non-volatile memory.

14. The hybrid density memory storage device according to claim 13, wherein the high speed volatile memory is selected from a group consisting of Static Random Access Memory (SRAM), Pseudo-Random Access Memory (PRAM) and Dynamic Random Access Memory (DRAM).

15. The hybrid density memory storage device according to claim 13, wherein the high speed non-volatile memory is selected from a group consisting of Ferro-electrical Random Access Memory (FeRAM), Magnetic Random Access Memory (MRAM) and Phase-Change Random Access Memory (PCRAM).

16. The hybrid density memory storage device according to claim 1, wherein the control unit comprises:
- a system interface, which acts as a transfer interface for commands and data including the first data and the second data between the host computer and the hybrid density memory storage device;
- a hot data verifying unit, which is coupled to the system interface, for registering the hot list; and
- a microprocessor, which is coupled to the system interface and the hot data verifying unit, and, based on the command issued by the host computer, identifies the operation mode of the host computer, causes the control unit to preload the first data or the second data to the hot data buffer for registry, and causes the control unit to determine whether the first data or the second data in the hot data buffer matches requirement of the commands issued by the host computer depending on the operation mode of the host computer.

17. The hybrid density memory storage device according to claim 16, wherein the control unit comprises:
- a data transfer buffer, which is coupled to the system interface for data registry;
- a first memory interface, which is coupled between the data transfer buffer and the non-volatile memory unit to receive the data transferred from the microprocessor; and
- a second memory interface, which is coupled between the data transfer buffer and the hot data buffer to receive the data transferred from the microprocessor.

18. The hybrid density memory storage device according to claim 1, further comprising a power management unit, wherein the power management unit is coupled to an external power source to receive an electrical power, and provide the received electrical power to the control unit, the non-volatile memory unit and the hot data buffer.

* * * * *